United States Patent
Chen et al.

(10) Patent No.: US 6,320,789 B1
(45) Date of Patent: Nov. 20, 2001

(54) METHOD OF CHISEL PROGRAMMING IN NON-VOLATILE MEMORY BY SOURCE BIAS

(75) Inventors: Yimin Chen, Nantou Hsien; Bin-Shing Chen, Hsinchu, both of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/636,523

(22) Filed: Aug. 10, 2000

(30) Foreign Application Priority Data

May 17, 2000 (TW) ............................................... 089109424

(51) Int. Cl.$^7$ .................................................. G11C 16/04
(52) U.S. Cl. ............................... 365/185.18; 365/185.16; 365/185.27; 365/185.28
(58) Field of Search ........................ 365/185.18, 185.27, 365/185.28, 185.16

(56) References Cited

U.S. PATENT DOCUMENTS

| | | | |
|---|---|---|---|
| 5,341,342 | * | 8/1994 | Brahmbhatt ..................... 365/185.18 |
| 5,659,504 | * | 8/1997 | Bude et al. ..................... 365/185.27 |
| 6,002,610 | * | 12/1999 | Cong et al. ..................... 365/185.05 |

* cited by examiner

*Primary Examiner*—Son T. Dinh
(74) *Attorney, Agent, or Firm*—Ladas & Parry

(57) ABSTRACT

A method of Chisel programming in non-volatile memory by source bias. Whereby when reading and/or programming operations are executed, a body reading voltage and a body programming voltage are used. The method is comprised of changing the body programming voltage to reduce the difference between the changed body programming voltage and the body reading voltage and then running the programming operation utilizing the changed body programming voltage. Advantages include: elimination of the negative effects of parasitic capacitors in memory cells, simplification of bias circuit design, enhanced device reliability, and reduced disturbance.

5 Claims, 2 Drawing Sheets

METHOD OF CHISEL PROGRAMMING IN NON-VOLATILE MEMORY BY SOURCE BIAS

BACKGROUND OF THE INVENTION

1. Field of the Invention

The present invention relates to a method of Chisel (CHannel Initiated Secondary ELectron) programming in non-volatile memory by source bias.

2. Description of the Related Art

In the last decade, flash non-volatile memory technologies have advanced substantially. Many array architecture and program/erase methodologies have been proposed to enable manufacturing of high speed and high density flash products. Recently, Chisel (CHannel Initiated Secondary ELectron) programming has attracted considerable attention because of its numerous advantages relative to competing methodologies. One of the primary advantages offered by Chisel programming is $V_{th}$ control which is absent in CHE (Channel Hot Electron) programming. With Chisel programming, non-volatile memory cells are rapidly programmed until they turn themselves off. Programmed code then saturates abruptly to $V_{th}$ which is regulated by control gate voltage. This allows Chisel programming to be used to correct over-erased bits, to operate without programming verification and is suitable for multilevel flash. Another advantage of Chisel programming is it requires less programming current/power to attain the same programming speed enabled by CHE making Chisel more suitable for low power applications. Moreover, it uses a back gate bias to resolve punch through and drain-coupled turn-on problems encountered when scaling CHE cells.

Figure 1:
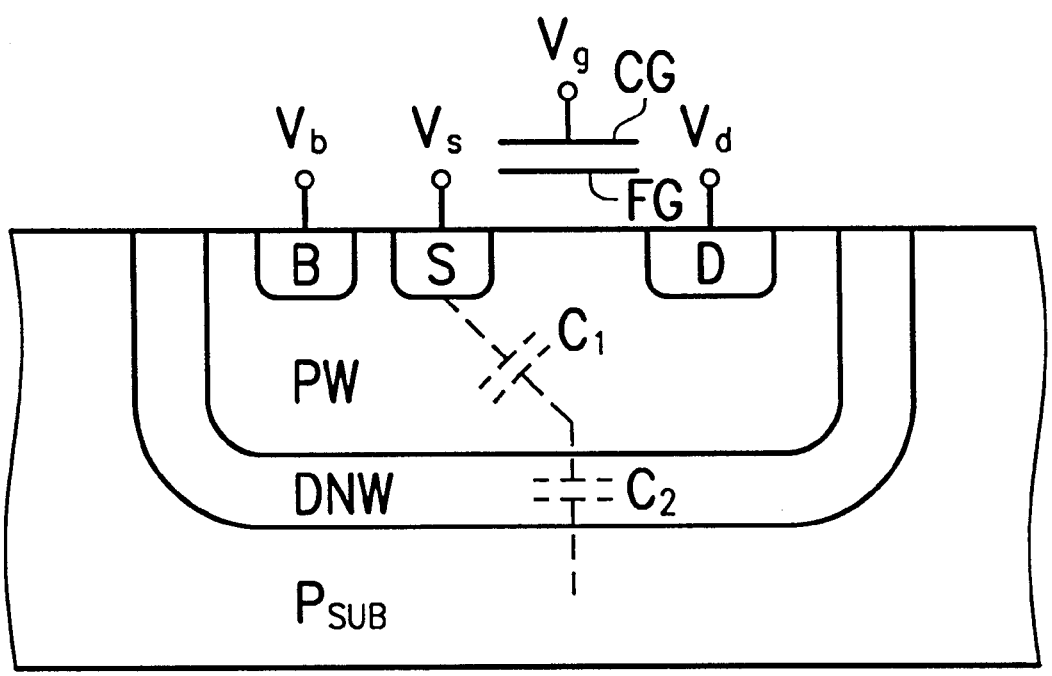

FIG. 1 is a diagram of a non-volatile memory cell, which is used to demonstrate conventional Chisel programming technique. The non-volatile memory cell is comprised of a P-substrate ($P_{sub}$) a deep N-well (DNW), a P-well (PW), a floating gate (FG), a control gate (CG), a N$^+$ doped region D serving as a drain, a N$^+$ doped region S serving as a source, a P$^+$ doped region B serving as a body, and four bias terminals $V_g$, $V_d$, $V_b$ and $V_s$.

Table 1 lists the bias of Chisel programming in non-volatile memory cells. In Table 1, $V_{dp}$, $V_{gp}$, $V_{sp}$ and $V_{bp}$ represent drain programming voltage, gate programming voltage, source programming voltage and body programming voltage respectively. $V_{dr}$, $V_{gr}$, $V_{sr}$ and $V_{br}$ represent drain reading voltage, gate reading voltage, source reading voltage and body reading voltage respectively. When programming is proceeding, a back-gate bias less than zero is needed, e.g., $V_{bp}-V_{sp}=-2\sim-3$ V. When reading is proceeding, $V_{br}$ is equal to zero.

TABLE 1

|  | Drain bias | Gate bias | Source bias | Body bias |
|---|---|---|---|---|
| programming | $V_{dp}$ = 3.3 V | $V_{gp}$ = 5 V | $V_{sp}$ = 0 V | $V_{bp}$ = -2~-3 V |
| reading | $V_{dr}$ = 1.2~1.5 V | $V_{gr}$ = 3.3 V | $V_{sr}$ = 0 V | $V_{br}$ = 0 V |

Despite Chisel programming's above-mentioned advantages, it still fails to overcome a number of problems. Because the difference between $V_{bp}$ and $V_{br}$ is 2~3 V, when switching the programming and reading biases while changing the potential of P-well (PW), both the parasitic capacitor ($C_1$) which exists between source S and the P-well (PW) as well as the parasitic capacitor ($C_2$) residing between the P-well (PW) and the P-substrate ($P_{sub}$) are charged. Even more problematic is that the parasitic capacitor ($C_2$) existing between the P-well (PW) and the P-substrate ($P_{sub}$) is relatively large while the power generated by the charging pump circuit is limited. Therefore, a relatively long charging time is required thereby reducing the switching speed between programming and reading biases.

As mentioned previously, there is no need for Chisel programming in non-volatile memory to execute programming verify. Nevertheless, proceeding with programming verify can enhance programming speed. Hence, adding the programming verify step in Chisel programming is beneficial to the enhancement of the programming speed. However, in practical terms, the switching speed between programming and reading is too slow to utilize programming verify. Moreover, the source disturbance phenomenon becomes worse with an increased number of devices as the hot carrier destroys the tunnel oxide layer thus reducing reliability of the device.

SUMMARY OF THE INVENTION

To resolve the above-mentioned problems, the invention provides a method of programming in non-volatile memory by source bias which prevents the negative effects of parasitic capacitors, simplifies the bias voltage circuit, enhances reliability of devices, and reduces disturbance.

The present invention provides a method of programming in non-volatile memory by source bias wherein during reading and programming operations, a substrate reading voltage and a substrate programming voltage are used to off-set the negative effects discussed above. The method is comprised of the following steps: changing the substrate programming voltage to reduce the difference between substrate programming voltage and substrate reading voltage thereby allowing the programming operation using the changed substrate programming voltage.

According to the embodiment of the invention, the changed body programming voltage is equal to the body reading voltage. Accordingly, the invention changes the biases needed in programming operations. By aligning body programming voltage and the body reading voltage, the negative effect produced by the parasitic capacitor in memory cells is alleviated, device reliability is enhanced and source disturbance is reduced.

BRIEF DESCRIPTIONS OF DRAWINGS

The following descriptions of the accompanying drawings serve as examples only and are not intended to limit the invention to the embodiments described herein.

Figure 2A:
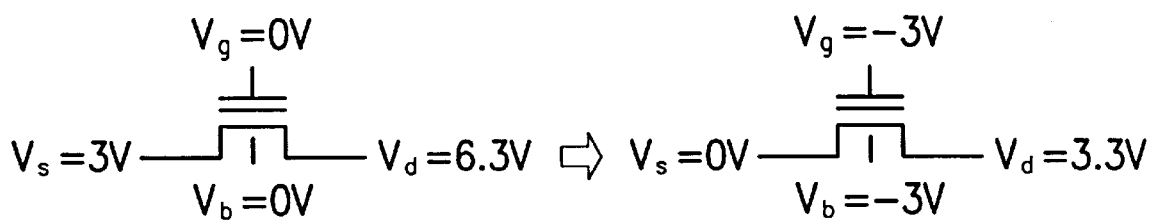
Figure 2B:
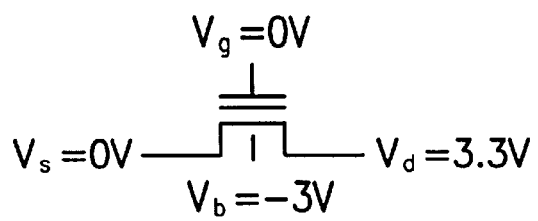

FIG. 1 diagrams a non-volatile memory cell;

FIG. 2A shows the biases for Chisel programming according to the invention when disturbance happens in programming; and FIG. 2B shows the biases for conventional Chisel programming when disturbances occur in programming.

DETAILED DESCRIPTION OF THE INVENTION

In the embodiment, the memory cell of Chisel programming in a non-volatile memory cell is the same as is found in the conventional Chisel programming. Hereafter, the embodiment is illustrated by FIG. 1 and Table 2.

Table 2 lists biases used in the embodiment according to the invention. The difference between conventional Chisel programming listed in Table 1 and Chisel programming according to the invention is that during the programming operation, all biases in Table 2 shift a value, such as 2~3 V, to make $V_{bp}$ and $V_{br}$ equal 0 V. Reading bias voltages are not changed.

TABLE 2

|  | Drain bias | Gate bias | Source bias | Body bias |
|---|---|---|---|---|
| Programming | $V_{dp}$ = 5.3~6.3 V | $V_{gp}$ = 7~8 V | $V_{sp}$ = 2~3 V | $V_{bp}$ = 0 V |
| Reading | $V_{dr}$ = 1.2~1.5 V | $V_{gr}$ = 3.3 V | $V_{sr}$ = 0 V | $V_{br}$ = 0 V |

With $V_{bp}$ and $V_{br}$ now the same, when programming and reading operations are switched, the source bias ($V_{sp}$) is changed while the voltage of the P-well (PW) is retained. Hence, it is now able to charge the parasitic capacitor $C_1$ between the source S and P-well (PW), and the capacitance of the parasitic capacitor $C_1$ is smaller than that of $C_2$ between the P-well (PW) and P-substrate ($P_{sub}$). Moreover, changing the source bias is usually achieved by executing a divider which provides higher power and enhanced switching speed between programming and reading functions as a result of the reduced charge time.

Therefore, adding programming verify in Chisel programming in non-volatile memory is possible without the negative effects mentioned previously. Indeed, there is no need to use more P-well (PW) to reduce the parasitic capacitor $C_2$ between the P-well (PW) and the P-substrate ($P_{sub}$) nor is more substrate area wasted.

Also, because body programming voltage ($V_{bp}$) is 0 V, no negative bias is needed. Therefore, additional negative bias voltage circuit is saved and circuit design is simplified.

FIG. 2A demonstrates the biases for Chisel programming when disturbance happens in programming according to the invention. In this example, $V_g$=0 V and the other voltages are the same as the original programming voltages. Their equivalent voltages are $V_g$=−3 V, $V_s$=0 V, $V_b$=−3 V and $V_d$=3.3 V.

FIG. 2B shows the biases for conventional Chisel programming when disturbance happens in programming. In this situation, $V_g$=0 V and the other voltages are the same as the original programming voltages, that is, $V_s$=0 V, $V_b$=−3 V and $V_d$=3.3 V.

In comparing FIG(s). 2A and 2B, one can see that using Chisel programming according to the invention to reduce disturbance in programming can also produce corresponding negative gate bias voltage of −3 V. Production of the corresponding negative gate bias voltage allows Chisel programming, according to the invention, to prohibit hot electrons from being injected into the floating gate thereby protecting the oxide layer beneath the gate from damage. Also, performance is enhanced relative to conventional Chisel programming. Hence, the method of programming according to the invention also prevents the oxide layer from being destroyed by hot electrons resulting in improved device reliability.

Lastly, while the invention has been described with reference to various illustrative embodiments, these descriptions are not intended to be construed in a limiting sense. Various modifications of the illustrative embodiments, as well as other embodiments of the invention, will be apparent to those persons skilled in the art upon reference to this description. It is therefore contemplated that the appended claims will cover any such modifications or embodiments as may fall within the scope of the invention defined by the following claims and their equivalents.

What is claimed is:

1. A method of Chisel programming in non-volatile memory by source bias, wherein while running both reading and programming operations, a substrate reading voltage, a gate reading voltage, a drain reading voltage, a source reading voltage, a substrate programming voltage, a gate programming voltage, a drain programming voltage and a source programming voltage are used, the method comprising the steps of:

changing the substrate programming voltage to reduce the difference between the changed substrate programming voltage and he substrate reading voltage;

changing the gate programming voltage, the drain programming voltage and the source programming voltage corresponding with the changing of the substrate programming voltage, wherein the changed substrate programming voltage, the gate programming voltage, the drain programming voltage and the source programming voltage are 0 V, 5~9 V, 3.8~6.3 V and 0.5~3 V, respectively; and running the programming operation by using the changed substrate programming voltage.

2. A method of Chisel programming in a non-volatile memory by source bias, wherein while running both reading and programming operations, a substrate reading voltage, a substrate programming voltage, a gate programming voltage, a drain programming voltage and a source programming voltage are used, the method comprising the steps of:

changing the substrate programming voltage to equal the substrate reading voltage;

changing the gate programming voltage, the drain programming voltage and the source programming voltage corresponding with the changing of the substrate programming voltage, wherein the changed substrate programming voltage, the gate programming voltage, the drain programming voltage and the source programming voltage are 0 V, 5~9 V, 8~6.3 V and 0.5~3 V, respectively; and running the programming operation by using the changed substrate programming voltage.

3. The method as claimed in claim 2, wherein while running both reading and programming operations, a substrate reading voltage, a gate reading voltage, a drain reading voltage, a source reading, a substrate programming voltage, a gate programming voltage, a drain programming voltage and a source programming voltage are used, the method comprising the steps of:

changing the substrate programming voltage to reduce the difference between the changed substrate programming voltage and the substrate reading voltage; and running the programming operation by using the changed substrate programming voltage.

4. A method of Chisel programming in non-volatile memory by source bias, wherein while running both reading and programming operations, a substrate reading voltage, a gate reading voltage, a drain reading voltage, a source reading voltage, a substrate programming voltage, a gate programming voltage, a drain programming voltage and a source programming voltage are used, the method comprising the steps of:

changing the substrate programming voltage to reduce the difference between the changed substrate programming voltage and the substrate reading voltage;

changing the gate programming voltage, the drain programming voltage and the source programming voltage corresponding with the changing of the substrate programming voltage, wherein the changed substrate programming voltage, the gate programming voltage, the drain programming voltage and the source programming voltage are 0 V, 5~9 V, 3.8~6,3 V and 0.5~3 V or their equivalent voltages, respectively; and running the programming operation by using the changed substrate programming voltage.

5. A method of Chisel programming in a non-volatile memory by source bias, wherein while running both reading and programming operations, a substrate reading voltage, a gate reading voltage, a drain reading voltage, a source reading voltage, a substrate programming voltage, a gate programming voltage, a drain programming voltage and a source programming voltage are used, the method comprising the steps of:

changing the substrate programming voltage to equal the substrate reading voltage;

changing the gate programming voltage, the drain programming voltage and the source programming voltage corresponding with the changing of the substrate programming voltage, wherein the changed substrate programming voltage, the gate programming voltage, the drain programming voltage and the source programming voltage are 0 V, 5~9 V, 3.8~6.3 V and 0.5~3 V or their equivalent voltages, respectively; and running the programming operation by using the changed substrate programming voltage.

* * * * *